United States Patent [19]

Dachiku

[11] Patent Number: 5,304,995
[45] Date of Patent: Apr. 19, 1994

[54] VARIABLE LENGTHCODING APPARATUS AND VARIABLE LENGTH DECODING APPARATUS

[75] Inventor: Kenshi Dachiku, Tokyo, Japan

[73] Assignee: Kabushiki Kaisha Toshiba, Kawasaki, Japan

[21] Appl. No.: 729,545

[22] Filed: Jul. 15, 1991

[30] Foreign Application Priority Data

Jul. 18, 1990 [JP] Japan .................. 2-190062

[51] Int. Cl.⁵ ................... H03M 7/40; H03M 7/42
[52] U.S. Cl. ............................. 341/67; 341/106
[58] Field of Search .......... 341/67, 106, 50, 65, 341/107; 358/260, 261

[56] References Cited

U.S. PATENT DOCUMENTS

| | | |
|---|---|---|
| 4,060,797 | 11/1977 | Maxwell et al. |
| 4,161,757 | 7/1979 | Spencer et al. |
| 4,177,456 | 12/1979 | Fukinuki et al. |
| 4,396,906 | 8/1983 | Weaver |
| 4,568,916 | 2/1986 | Bahgat ................ 341/67 |
| 4,591,829 | 5/1986 | Takeda ................ 341/67 X |

FOREIGN PATENT DOCUMENTS

| | | |
|---|---|---|
| 0070387 | 1/1983 | European Pat. Off. |
| 0083407 | 7/1983 | European Pat. Off. |
| 0283735 | 9/1988 | European Pat. Off. |
| 2735319 | 3/1978 | Fed. Rep. of Germany |
| 3711200 | 12/1987 | Fed. Rep. of Germany |
| 9106153 | 5/1991 | World Int. Prop. O. ........... 341/67 |

OTHER PUBLICATIONS

M. E. Lukacs, "Variable Word Length Coding for a High Data Rate DPCM Video Coder," Proc. of Picture Coding Symposium, 1986, pp. 54-56.

Patent Abstracts of Japan, vol. 12, No. 367(E-644), Sep. 30, 1988, & JP-A-63-117564, May 21, 1988, K. Nakajima, "Huffman Coder".

H. Fujiwara et al, "VLSI Implementation of a Flexible Variable-Length Decoding Processer for Real-time Video," Third international workshop on 64 kbit/s coding of moving video, 1990.

Primary Examiner—Sharon D. Logan
Attorney, Agent, or Firm—Oblon, Spivak, McClelland, Maier & Neustadt

[57] ABSTRACT

A variable length coding apparatus comprises a register for holding a current condition, a ROM for outputting the to-be-transited next state and one data in accordance with a predetermined state transition, a selector for inputting the state corresponding to the information signal value to the register every time the to-be-coded information signal is inputted, and a circuit to feed back the state outputted from the ROM to the register, and the ROM outputs the variable length codes corresponding to the information signal as the above-mentioned data every time the state transits.

5 Claims, 9 Drawing Sheets

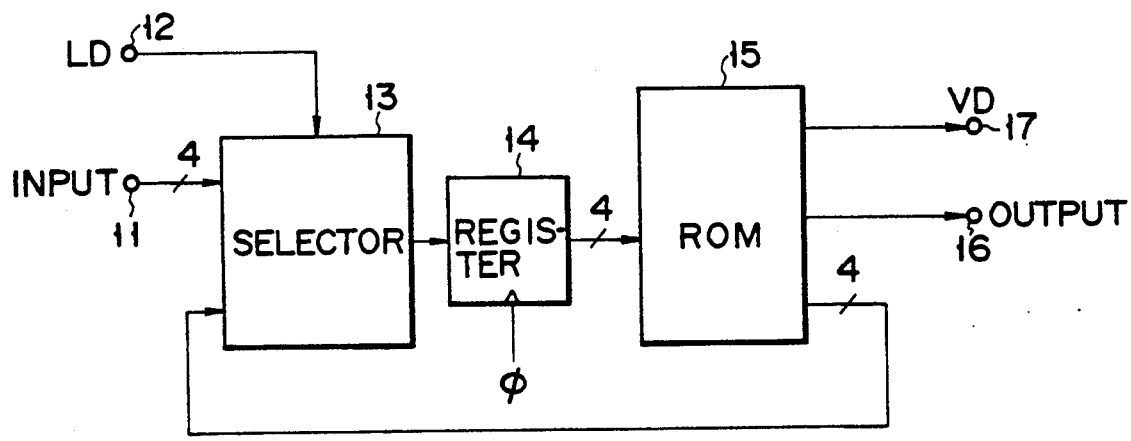
FIG. 1
| INPUT VALUE | VARIABLE LENGTH CODES | | | | |
|---|---|---|---|---|---|
| 0 | 1 | | | | |
| 1 | 0 | 1 | | | |
| 2 | 0 | 0 | 0 | 0 | 1 |
| 3 | 0 | 0 | 0 | 1 | |
| 4 | 0 | 0 | 1 | 0 | |
| 5 | 0 | 0 | 1 | 1 | 0 |
FIG. 2
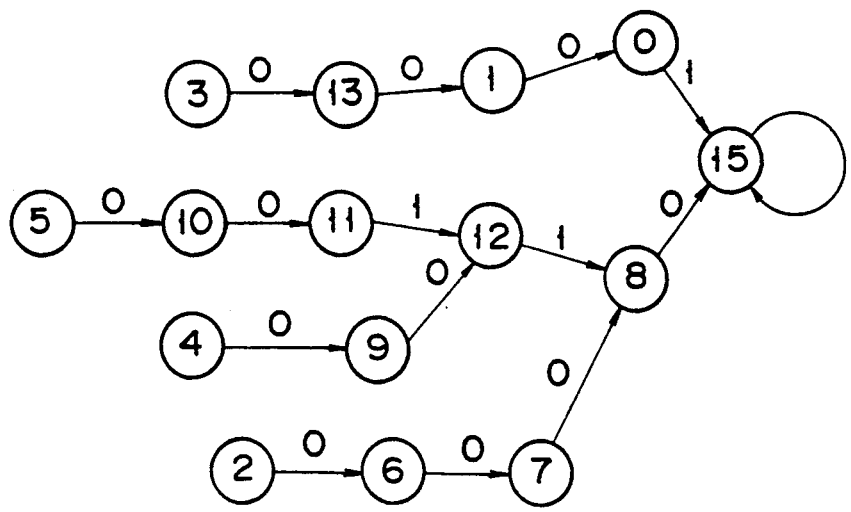
FIG. 3

| ROM INPUT (ADDRESS) | ROM OUTPUT | | |
|---|---|---|---|
| | LOWER 4 BITS | CODE BIT | V D |
| 0 | 15 | 1 | 0 |
| 1 | 0 | 0 | 0 |
| 2 | 6 | 0 | 0 |
| 3 | 13 | 0 | 0 |
| 4 | 9 | 0 | 0 |
| 5 | 10 | 0 | 0 |
| 6 | 7 | 0 | 0 |
| 7 | 8 | 0 | 0 |
| 8 | 15 | 0 | 0 |
| 9 | 12 | 0 | 0 |
| 10 | 11 | 0 | 0 |
| 11 | 12 | 1 | 0 |
| 12 | 8 | 1 | 0 |
| 13 | 1 | 0 | 0 |
| 15 | 15 | — | 1 |
F I G. 4
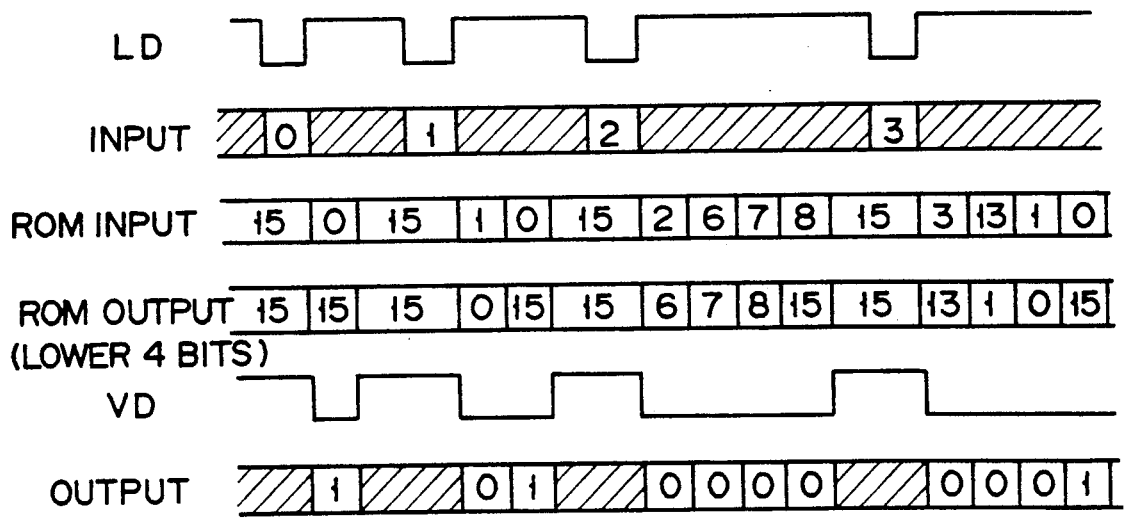
F I G. 5

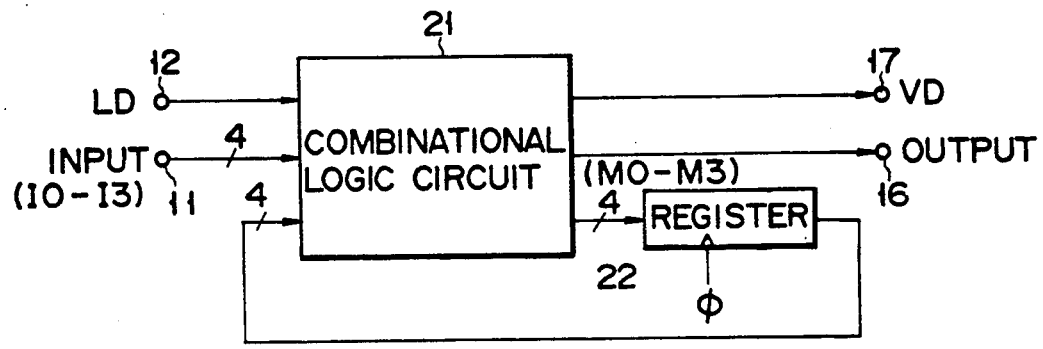
F I G. 6
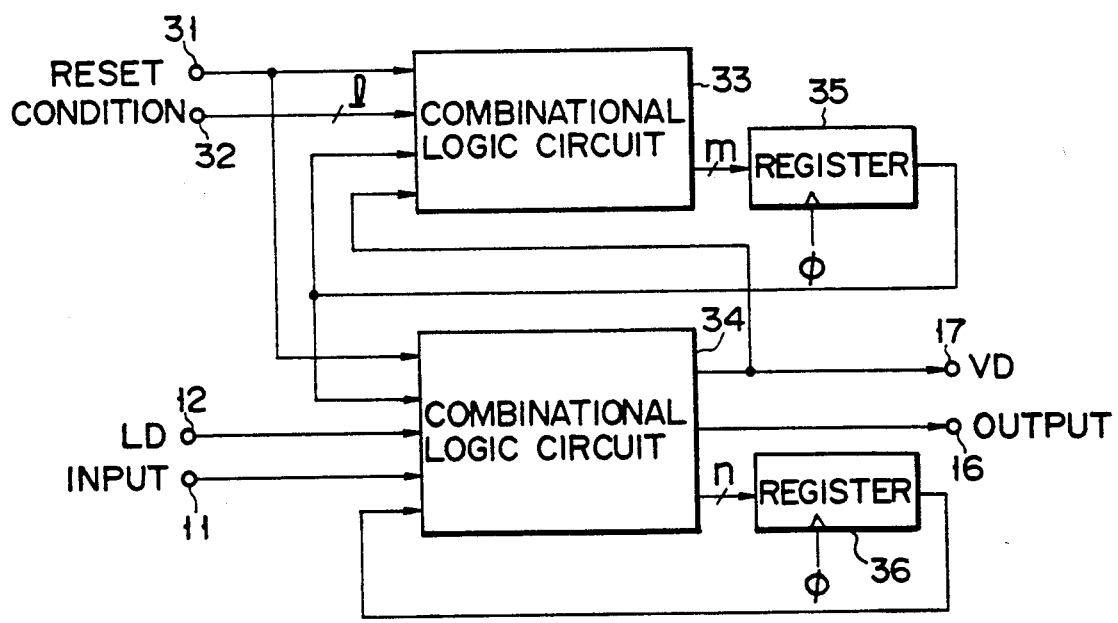
F I G. 8

```
M3 ::= !(M0 & !M1 &  M2 &  M3
      # !M0 &  M1 & !M2 &  M9
      # !M0 &  M1 &  M2 &  M3
      #  M0 & !M1 &  M2 &  M3
      #  I3 & !LD);

M2 ::= !(M0 & !M1 &  M2 &  M3
      # !M0 &  M1 & !M2 &  M3
      # !M0 &  M1 &  M2 & !M3
      #  M0 & !M1 & !M2 &  M3
      # !M0 & !M1 &  M2 &  M3
      #  M0 & !M1 &  M2 & !M3
      # !M0 &  M1 &  M2 &  M3
      #  M0 &  M1 &  M2 &  M3
      #  I2 & !LD);

M1 ::= !(M0 & !M1 &  M2 &  M3
      # !M0 &  M1 &  M2 &  M3
      # !M0 &  M1 &  M2 &  M3
      #  M0 & !M1 & !M2 &  M3
      #  M0 & !M1 &  M2 &  M3
      #  M0 &  M1 & !M2 &  M3
      # !M0 &  M1 &  M2 &  M3
      #  M0 &  M1 &  M2 &  M3
      #  I1 & !LD);

M0 ::= !(M0 & !M1 &  M2 &  M3
      # !M0 &  M1 & !M2 & !M3
      # !M0 &  M1 &  M2 &  M3
      #  M0 & !M1 & !M2 &  M3
      #  M0 & !M1 &  M2 &  M3
      #  M0 &  M1 & !M2 &  M3
      # !M0 &  M1 &  M2 &  M3
      #  M0 &  M1 &  M2 &  M3
      #  I0 & !LD);

VD = !( M0 & !M1 &  M2 &  M3
     #  M0 &  M1 & !M2 & !M3
     # !M0 &  M1 & !M2 &  M3
     #  M0 &  M1 & !M2 &  M3
     # !M0 & !M1 &  M2 &  M3
     #  M0 & !M1 &  M2 &  M3
     # !M0 &  M1 &  M2 & !M3
     #  M0 &  M1 &  M2 & !M3
     # !M0 &  M1 &  M2 &  M3
     #  M0 & !M1 &  M2 &  M3
     # !M0 & !M1 &  M2 &  M3
     #  M0 & !M1 &  M2 &  M3
     # !M0 &  M1 &  M2 &  M3
     #  M0 &  M1 &  M2 &  M3);

COD = !( M0 & !M1 &  M2 &  M3
      # !M0 &  M1 &  M2 & !M3
      # !M0 &  M1 &  M2 &  M3
      #  M0 &  M1 & !M2 &  M3
      # !M0 & !M1 &  M2 &  M3
      #  M0 & !M1 &  M2 &  M3
      # !M0 &  M1 &  M2 &  M3
      #  M0 &  M1 &  M2 &  M3
      # !M0 &  M1 &  M2 &  M3
      #  M0 & !M1 &  M2 &  M3
      # !M0 & !M1 &  M2 &  M3
      #  M0 & !M1 &  M2 &  M3
      # !M0 &  M1 &  M2 &  M3
      #  M0 &  M1 &  M2 &  M3);
```

FIG. 7

| ROM INPUT | | ROM OUTPUT | |
|---|---|---|---|
| MSB | LOWER 4 BITS | LOWER 4 BITS | MSB |
| 0 | 0 | 15 | 1 |
| 1 | 1 | 1 | 1 |
| 1 | 1 | 1 | 1 |
| 0 | 7 | 5 | 0 |
| 0 | 8 | 4 | 0 |
| 0 | 9 | 2 | 0 |
| 0 | 10 | 9 | 1 |
| 0 | 11 | 10 | 1 |
| 0 | 15 | 11 | 1 |
| 1 | 0 | 15 | 1 |
| 1 | 1 | 1 | 1 |
| 1 | 1 | 1 | 1 |
| 1 | 7 | 15 | 1 |
| 1 | 8 | 7 | 1 |
| 1 | 9 | 3 | 0 |
| 1 | 10 | 8 | 1 |
| 1 | 11 | 1 | 0 |
| 1 | 15 | 0 | 0 |

F I G. 11

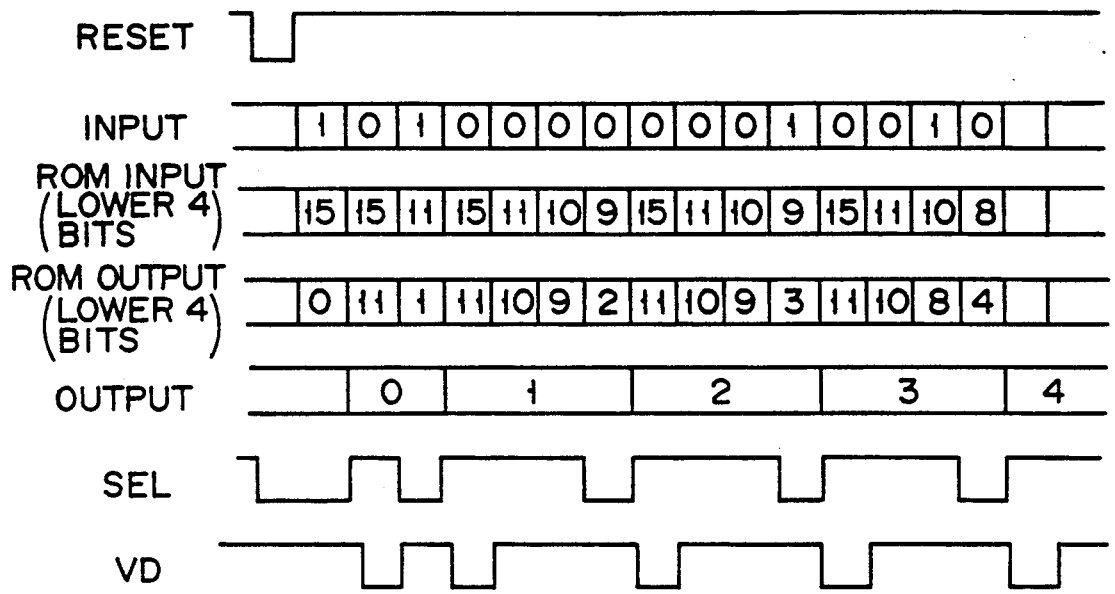
F I G. 12
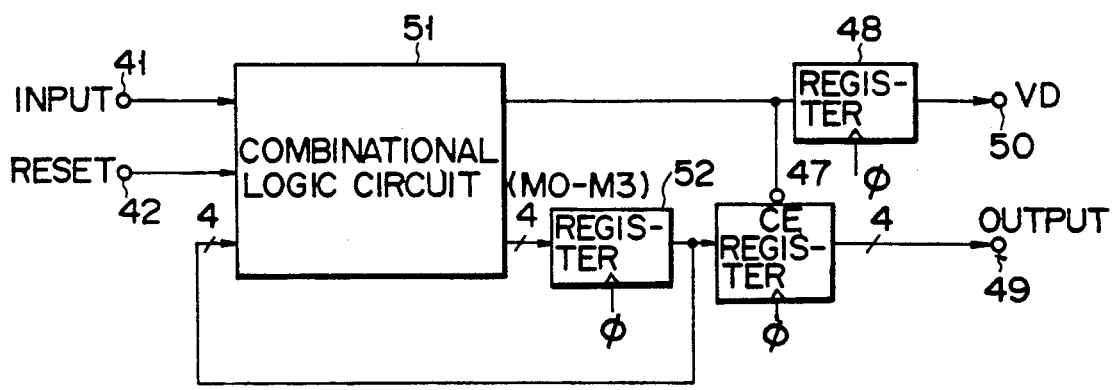
F I G. 13

```
VD = !(!M0 & !M3 # !M1 & !M3 # !M2 & !M3);

M3 := !(M0 & M1 & M2 & !M3 & RST
     # !M1 & !M2 & M3 & RST
     # I & M0 & M1 & M3 & RST);

M2 := !(M0 & !M2 & M3 & RST # M1 & !M2 & M3 & RST # M0 & M1 & M3 & RST);

M1 := !(!I & M0 & M1 & M2 & !M3 & RST
     # !I & !M0 & !M2 & M3 & RST
     # !M0 & M1 & !M2 & M3 & RST
     # I & M0 & M1 & M3 & RST);

M0 := !(!I & !M1 & !M2 & M3 & RST
     # I & !M0 & M1 & !M2 & M3 & RST
     # !I & M0 & !M2 & M3 & RST
     # I & M0 & M1 & M2 & RST);
```

FIG. 14

VARIABLE LENGTHCODING APPARATUS AND VARIABLE LENGTH DECODING APPARATUS

BACKGROUND OF THE INVENTION

1. Field of the Invention

The present invention relates to a variable length coding apparatus which variable-length-codes the audio, image, data, and other information signals and generates coded arrays and a variable length decoding apparatus which decodes variable length coded arrays.

2. Description of the Related Art

Variable length coding is an encoding system to compress the information content by assigning a short code to the information of high occurrence probability and a long code to the information of low occurrence probability by the use of statistical properties which audio, image, data, and other information signals posses when these information signals are encoded.

In case of the image, for example, the differences of adjacent pixels are concentrated to the vicinity of zero because the correlation between adjacent pixels is high. Therefore, assigning a pixel whose absolute value of the difference is small to a short code and that of large absolute value to a long code enables the compression of the information content. In case of the binary image such as facsimile data, encoding the white length and the black length (run-length coding) and assigning the run length with higher occurrence probability to a short code and that with lower occurrence probability to a long code enables the compression of the information content.

The variable length coding apparatus which carries out coding with the code length made variable generally has a variable length ROM (read-only memory) which stores in advance a variable length code table listing the encoded information signal with correspondence to the variable length code, and a word length ROM, a shift register, and a word length counter.

According to this type of conventional apparatus, information signals comprising n-bit digital data are inputted to the first input terminal, while load pulses are inputted to the second input terminal. The information data is converted to the variable length code and k-bit word length data by the variable length ROM and the word length ROM, and loaded into the shift register and the word length counter, respectively, by the load pulse. The word length counter counts down with the digital value of the loaded word length data designate as an initial value and stops counting when the contents reduce to zero. During the period between the loading of the word length data to the word length counter and the decrement of the data to zero, the output signal of the output terminal is "L," indicating that the variable length coded data from the shift register will appear at the output terminal during this period.

This conventional variable length coding apparatus has a problem that the output of the ROM requires a large number of bits. For example, if the maximum length of the variable length code is 20 bits and input information signal is the $n=8$ bit data, the word length counter outputs needs $k=5$ bits. Therefore, the variable length ROM must have $n=8$ bit address inputs and 25-bit outputs. As a result, four memories each having 8 bits are required. In addition to the ROM of such a large number of bits, the conventional variable length coding apparatus needs a large shift register and a counter, resulting in a large circuit scale.

On the other hand, the variable length decoding apparatus which decodes the variable length codes generally has a shift register, ROM for storing the variable length codes with correspondence to decoded values, and a word length counter.

According to the conventional decoding apparatus, the variable length coded array is inputted to the first input terminal and the reset pulse is inputted to the second terminal at the first timing of the variable length coded array. The word length counter is reset with the reset pulse via a gate and every time one variable length coded array is inputted to the first input terminal, the word length counter counts up by the clock. The variable length coded array is inputted to the shift register in series and shifted by 1 bit. The k-bit word length data outputted from the word length counter and the shifted variable length coded array are given to provided to the ROM. The ROM stores the variable length code table which lists variable length codes with correspondence to decoded values, and if a coded array with the word length removed from the shift register output is located on the variable length code table, the ROM outputs the decoded value and the coincidence pulse VD of negative logic. The coincidence pulse VD is latched with a latch and outputted from the output terminal. The decoded value outputted from the ROM by the coincidence pulse is latched by a latch and outputted from the output terminal. The coincidence pulse is supplied to the word length counter as well via gate and resets the word length counter.

In this conventional variable length decoding apparatus, a ROM with a large number of bits is required. For example, if the maximum code length of the variable length code is 20 bits and the decoded value (information signal) in $n=8$ bit data, same as that described before, the output of the word length counter requires $k=5$ bits, and ROM requires the address input of $20+5=25$ bits and the output of 9 bits which is yielded by adding 8 bits of decoded value to 1 bit of the coincidence pulse, requiring a capacity as large as $32M \times 9$ bits.

As described above, in the conventional variable length coding and decoding apparatus, the variable length code tables are stored in a ROM and a large storage capacity ROM is needed, creating a problem that the circuit scale is extremely large.

SUMMARY OF THE INVENTION

The objective of this invention is to provide a variable length coding apparatus and a variable length decoding apparatus which can be realized with smaller-scale hardware than the conventional devices.

The variable length coding apparatus of the present invention comprises a state holding circuit for holding the current state, a state transition circuit for outputting the next state to transition and one-bit data in accordance with the predetermined state transition in correspondence to the current state of the state holding circuit, an input circuit for inputting the state corresponding to the information signal to the state holding circuit every time the to-be-coded information signal is inputted, and a feed back circuit to feed back to the state holding circuit the state outputted from the state transition circuit while the information signal is not inputted, and is configured in such a manner that the variable length codes corresponding to the information signal is outputted as the one-bit data every time the state transition circuit shifts the state.

In a variable length coding apparatus using a multiple number of variable length code tables listing the to-be-coded information signals in correspondence to the variable length codes, the variable length code table to be used next is selected from the multiple number of variable length code tables and the state transition circuit outputs the next transition state and one-bit data in accordance with the predetermined state transition with respect to the variable length table selected as above in response to the current state of the state holding circuit.

On the other hand, the variable length decoding apparatus of the present invention comprises a state holding circuit, a state transition circuit for outputting the next transition state and one-bit data in accordance with the predetermined state transition in response to the current state of the state holding means and to-be-decoded variable length codes, a setting circuit for setting the state holding circuit to a specified state every break-point of the to-be-decoded variable length codes, and a feed back circuit for feeding back the state to the state holding circuit when a specified state is outputted from the state transition circuit, and is configured in such a manner that the decoded value of the variable length code is outputted as the aforementioned data every time the state transition means shifts the state.

In the variable length decoding apparatus which decodes the variable length codes encoded by using a multiple number of variable length coding tables, the variable length coding table used for coding is determined from the multiple number of the variable length coding tables, and the state transition circuit outputs a next transition state and a delimiter signal in accordance with the predetermined state transition with respect to the variable length table determined as above in response to the current state of the state holding circuit.

In this invention, designing the apparatus to output the variable length code or its decoded value by the use of state transition requires only the address inputs equivalent to the total number of the states when a ROM is used for the state transition circuit, thereby greatly reducing the ROM capacity as compared to the conventional apparatus which stores the variable length code tables in ROM.

For example, if in the coding apparatus, the maximum coding length of the to-be-outputted variable length code is 20-bit data and the to-be-coded information signal is 8-bit data, the total of the information signal values is 256. Thus, only 512 signal values must be prepared for the total of the states. Accordingly, the ROM is only required to have 9 bits for the address input and 11 bits for the output (including variable length coded output and indication signals).

On the other hand, in the decoding apparatus, if the maximum coding length of the to-be-decoded variable length code is 20-bit data and the total of the information signal values is 256, only about 512 signal values are required for the total of the states and the 512×9 bits are sufficient for the ROM capacity. The state transition circuit can be realized by the combinational logic circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing a variable length coding apparatus;

FIG. 2 is a drawing showing an example of variable length coding table;

FIG. 3 is a state transition diagram to variable-length-encode the data in accordance with FIG. 2 by means of the embodiment of FIG. 1;

FIG. 4 is a drawing showing an I/O of ROM;

FIG. 5 is a timing chart showing the operation of the embodiment of FIG. 1;

FIG. 6 is a block diagram showing a variable length coding apparatus using a combinational logic circuit according to the other embodiment related to the present invention;

FIG. 7 is a diagram showing a logical expression used to configure the combinational logical circuit of FIG. 6;

FIG. 8 is a block diagram of a variable length coding apparatus using two combinational logical circuits according to another embodiment related to the present invention;

FIG. 11 is a drawing showing an I/O of the ROM shown in FIG. 9;

FIG. 12 is a timing chart showing the operation of the variable length decoding apparatus of FIG. 9;

FIG. 13 is a block diagram showing a variable length decoding apparatus according to another embodiment related to the present invention;

FIG. 14 is a diagram showing a logical expression in FIG. 13; and

DETAILED DESCRIPTION OF THE PREFERRED EMBODIMENTS

Figure 9:
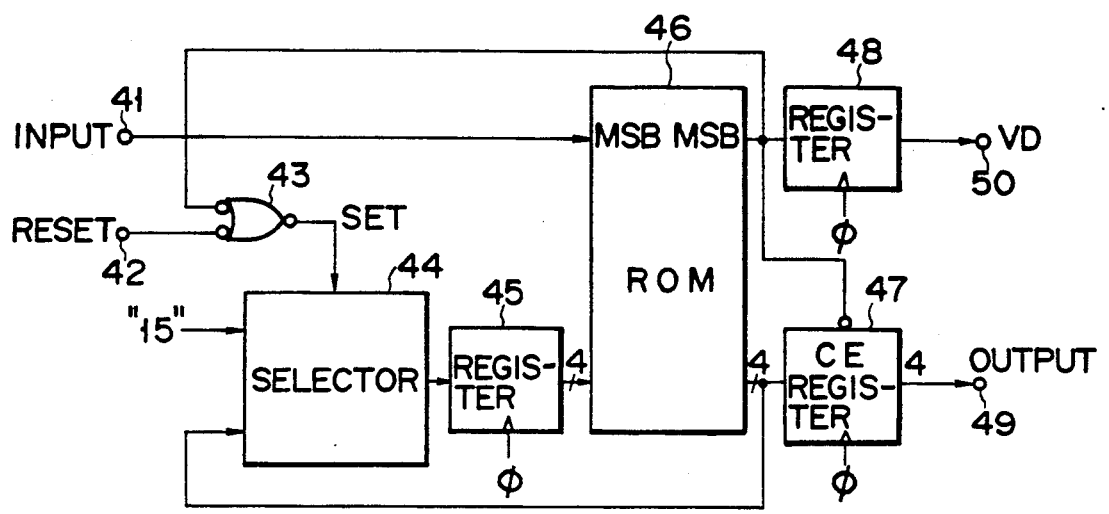
FIG. 9 is a block diagram showing one embodiment of the variable length decoding apparatus related to the present invention.

According to FIG. 1, the variable length coding apparatus comprises a selector 13, a register 14 for holding the state, and ROM 15 for shifting the state. To the input terminal 11, the to-be-coded information signals are inputted, while to the input terminal 12, the load pulse LD is inputted. The selector 13 is operated by clock and selects the information signal inputted to the input terminal 11 while the load pulse LD is given, and except the period, the selector selects the state signal outputted from ROM 15. The register 14 holds the signal selected by the selector 13 as a state signal.

ROM 15 has, for example, 4 bits for the address input and 6 bits for output, and using the state signal held in the register 14 as an address input, it outputs the to-be-shifted next state signal as lower 4-bit data as well as outputting the coded bit showing the variable length code to the output terminal, and outputs the 1-bit output signal VD showing the period when the variable length code is effectively outputted from the output terminal 16 as the code bit.

Now referring to FIG. 2 through FIG. 5, the operation of this variable length coding apparatus is described.

FIG. 2 is an example of a variable length coding table prepared by using the Huffman encoding method, in which the information signal is encoded in accordance with the probability of occurrence, that is, the frequently occurring information signal is encoded with a short bit length and the information signal is encode with a longer bit length as the occurrence rate decreases, FIG. 3 shows a state transition diagram to encode in accordance with the code table of FIG. 2, and FIG. 4 shows the contents of ROM 15 based on the state transition diagram of FIG. 3. FIG. 5 shows a timing chart when the information signal called "0123" is applied to the input terminal 11. However, the information signal (input value) is expressed with the 4-bit parallel digital data, for example.

First of all, at the timing when the initial value "0" of the information signal is inputted to the input terminal, the information signal is selected by the selector 13 in response to the load pulse LD and "0" is held at the register 14 as the current state signal. With this, the address input of ROM 15 becomes "0". In this event, as shown in FIG. 3 and FIG. 4, "1" is outputted to the output terminal 16 from ROM 15 as a code bit indicating the variable length code and at the same time the output signal VD to the output terminal 17 becomes "0", which indicates that the code bit is effective. "15" is outputted from ROM 15 as the state signal following "0", and is fed back to the register 14 via the selector 13 before the next value of the information signal is inputted. Consequently, the address input of ROM 15 is "15". With this, as clear from the table in FIG. 4, the output signal VD corresponding to the address "15" becomes "1", indicating that variable-length encoding of the initial value of the information signal is completed. That is, the variable length code output in this event is "1".

In accordance with the instruction that the encoding is completed, the next value "1" of the information signal is inputted to the input terminal 11 and held at the register 14 via the selector 13. With this, the address input of ROM 15 becomes "1" and first of all "0" is outputted as a code bit indicating the variable length code to the output terminal 16 from ROM 15 and at the same time the output terminal 16 from ROM 15 and at the output signal VD becomes "0", and "0" is outputted as the state signal following "1". This state signal "0" is fed back to the register 14 via the selector 13 and "1" is outputted to the output terminal 16 from ROM 15 as a variable length code and the output signal VD becomes "0". "15" is outputted as the next state signal following "0". This state signal "15" is fed back to the register 14 via the selector 13 to bring the output signal VD to be "1", indicating that the variable length encoding for the next value of the information signal is completed. That is, the variable length code output in this event is "01".

Then, the next value "2" of the information signal is inputted to the input terminal 11 and held at the register 14 via the selector 13. With this, the address input of ROM 15 becomes "2" and first of all "0" is outputted as a code bit indicating the variable length code to the output terminal 16 from ROM 15 and at the same time the output signal VD becomes "0". "6" is outputted as the state signal following "2". This state signal "6" is fed back to the register 14 via the selector 13 and because the address input of ROM 15 becomes "6", "0" is outputted to the output terminal 16 from ROM 15 as a variable length code and the output signal VD becomes "0". "7" is outputted as the next state signal following "6". This state signal "7" is fed back to the register 14 via the selector 13 to bring the address input of ROM 15 to be "7", and "0" is outputted to the output terminal 16 as a variable length code from ROM 15 as well as bringing the output signal VD to be "0". "8" is outputted as the state signal following "7". This state signal "8" is fed back to the register 14 via the selector 13 to bring the address input of ROM 15 to be "8", and "0" is outputted to the output terminal 16 as a variable length code from ROM 15 as well as bringing the output signal VD to be "0". "15" is outputted as the state signal following "8". This state signal "15" is fed back to the register 14 via the selector 13 to bring the output signal VD to be "1", indicating that the variable length encoding for the next value of the information signal is completed. That is, the variable length code output in this event is "0000."

Hereinafter, in the same manner, the variable-length-encoding is carried out in accordance with the state transition diagram shown in FIG. 3 and the table in FIG. 4.

FIG. 6 is another embodiment of the variable length coding apparatus related to the present invention, in which a combinational logical circuit 21 combining AND, OR gate, inverter, etc. is used in place of ROM 15 of FIG. 1. The register 22 corresponds to the register 14 in FIG. 1 and because the combinational logical circuit 21 has functions of the selector 13 in FIG. 1 in this event, the register 22 is directly inserted between the state signal input and the output of the combinational logical circuit 21. That is, the combinational logical circuit 21 logically process the input signal in accordance with the logical expression shown in FIG. 7. In the logical expression of FIG. 7, "!" shows a logical NOT, "&" shows a logical AND, "#" shows a logical OR, and M0-M3 show state bits, respectively. Also, "=" shows the output of the logical circuit, and ":=" shows the output of the register.

FIG. 8 shows another embodiment of a variable length coding apparatus related to the present invention, which uses multiple number of variable length code tables. In this embodiment, two combinational logical circuits 33 and 34 are used.

The first combinational logical circuit 33 decides which variable length code table to be used, is reset to the initial state by the reset signal to be inputted to the input terminal 31, and determines the initial table number from the multiple number of variable length code tables to output. The second combinational logical circuit 34 is configured in accordance with the logical expression corresponding to the state transition predetermined on the basis of each of the multiple number of variable length code tables, and the basic functions are same as those of ROM 15 of FIG. 1 or of the combinational logical circuit 21 of FIG. 6, and carries out the variable length coding in accordance with the state transition diagram corresponding to the variable length coding table decided by the first combination logical circuit 33. The first combinational logical circuit 33 is given conditions to determine which information signal is to be encoded next from the input terminal 32 and outputs the table No. in accordance with the specified rule.

It is possible to substitute the combinational logical circuits 33 and 34 of FIG. 8 with ROM.

Now, the embodiment of the variable length decoding apparatus is described.

FIG. 9 is a block diagram showing one embodiment of the variable length decoding apparatus related to the present invention. This variable length decoding apparatus comprises a gate circuit 43, a selector 44, a register 45 as a state holding circuit, ROM 46 as a state transition circuit, and registers 47 and 48. To the input terminal 41, the to-be-decoded variable length code is inputted, while the reset pulse is inputted to the input terminal 42. The selector 44 is provided with the output of the gate 43 as a select signal SEL and selects either one of the signal corresponding to the state "15" (digital data) or the state signal outputted from ROM 46. The register 45 is operated by the clock and holds the signal selected at the selector 44 as a state signal.

ROM 46 outputs the next state signal as the lower 4 bits by giving the bits of the variable length code inputted into the input terminal 41 to the address input MSB (most significant bit) and the state signal held in the register 45 to the lower 4 bits of the address input and then outputs the signal showing the breakpoint of the variable length code as MSB. The register 47 holds the lower 4-bit output of ROM 46 by the clock and outputs the decoded signal to the output terminal 49. The register 50 holds the MSB output of ROM 46 with the clock and provides to the output terminal 49 with the output signal VD indicating the period when the decoded value is outputted.

Figure 10:
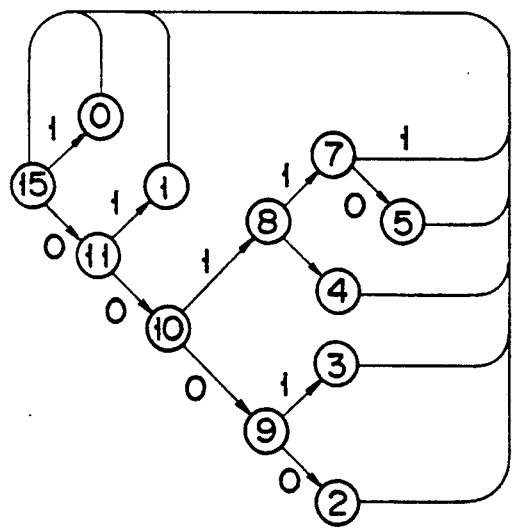
FIG. 10 is a state transition diagram to variable-length-decode the variable length code of FIG. 2 using the variable length decoding apparatus of FIG. 9.

Next, the operation of this variable length decoding apparatus is described. The variable input length codes are those shown in FIG. 2. FIG. 10 is a state transition diagram for variable-length-decoding, and FIG. 11 is a drawing showing an I/O relationship of the ROM 15 storing the variable length decode table based on the state transition diagram of FIG. 3. FIG. 12 is a timing chart when a sequence of variable length codes "101000000010010" is inputted to the input terminal 41.

First of all, inputting the reset pulse to the input terminal 42 causes the selector 44 to select the state signal "15" and the register 45 to hold the "15" as the current state signal. With this operation, the lower 4 bits of the address input of ROM 46 is set to "15".

Inputting the first bit of the above-mentioned sequence of variable length codes to the input terminal 41 under this state allows the MSB of the address input of ROM 46 to be "1"and, therefore, the lower 4-bit output of ROM 46 becomes "0", as shown in the state transition diagram of FIG. 10 and in the lower part of the table in FIG. 11. Consequently, the MSB output which corresponds to the lower 4 bits "0" becomes "0", showing a breakpoint of the variable length code as shown in the bottom line of the table. When the MSB output of ROM 46 is "0", the register 47 enters the enable state, and the lower 4-bit output "0" in this event is held by the register 47 and "0" is outputted as a decoded value from the output terminal 49. In this event, the output signal of the register 48, that is, output signal VD to the output terminal 50 becomes "0", which indicates that the decoded value is outputted from the output terminal 49.

When the MSB output of ROM 46 becomes "0", this MSB output "0" passes through the gate circuit 43 and the select signal SEL of "0" is inputted to the selector 44. Consequently, the state signal "15" is selected and held in the register 45. With this, the lower 4 bits of the address input of ROM 46 are set to "15".

Inputting the second bit ("b 0") of the variable length coded array under this state and bringing the MSB of the address input of ROM 46 to be "0", the lower 4-bit output of ROM 46 becomes "11" as shown in the state transition diagram of FIG. 10. Then, inputting the third bit ("1") of the variable length coded array allows the lower 4-bit output of ROM 46 to shift from "11" to "1" as well as bringing the MSB output to be "0" which indicates the breakpoint of the variable length code. Consequently, this lower 4-bit output "1" is held in the register 47 and outputted from the output terminal 49 as a decoded value, and becomes "0" which indicates that the decoded value is outputted from the output terminal 49 for the output signal VD of the output terminal 50.

Hereinafter, in the same manner, the variable-length-decoding is carried out in accordance with the state transition diagram shown in FIG. 10.

FIG. 13 is another embodiment related to the present invention showing a variable length decoding apparatus, in which a combinational logical circuit 51 combining AND, OR gate, inverter, etc. is used in place of ROM 46 of FIG. 9. The register 52 corresponds to the register 45 in FIG. 9 and because the combinational logical circuit 51 has functions of the selector 45 in FIG. 9 in this event, the register 52 is directly inserted between the input and the output of the state signal of the combinational logical circuit 51.

FIG. 14 is an example of the logical expression of the combinational logical circuit 51 in FIG. 13, indicating the case in which the state transition diagram of FIG. 10 is implemented.

Figure 15:
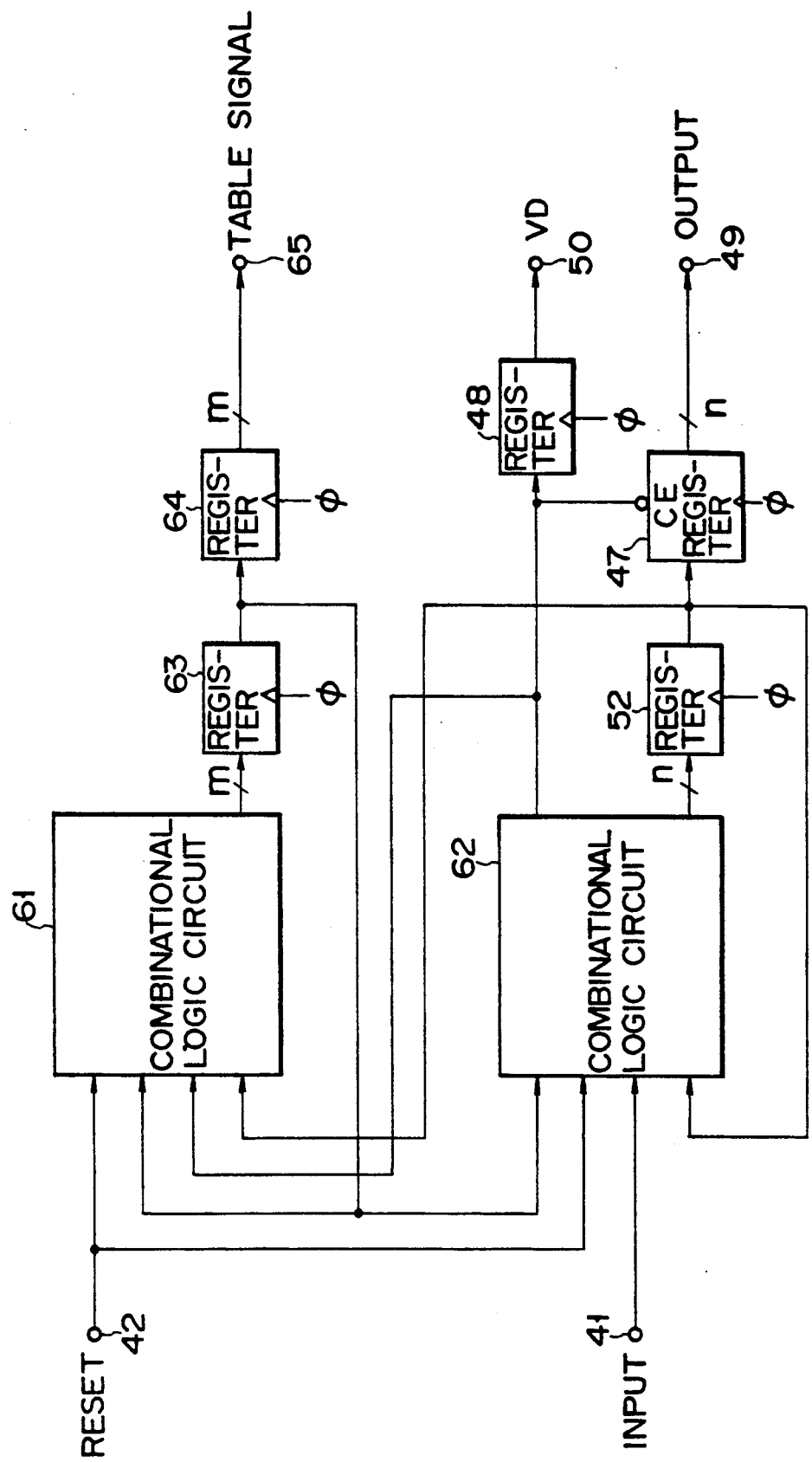
FIG. 15 is a block diagram of a variable length decoding apparatus according to another embodiment related to the present invention.

FIG. 15 shows another embodiment of a variable length decoding apparatus related to the present invention, which uses multiple number of variable length code tables. In this embodiment, two combinational logical circuits 61 and 62 are used.

The first combinational logical circuit 61 is reset to the initial state by the reset signal inputted to the input terminal 42 and decides the initial table number from the multiple number of the variable length code tables and outputs the result to the output terminal 65 via the registers 63 and 64. The second combinational logical circuit 62 is configured in accordance with the logical expression corresponding to the state transition predetermined on the basis of each one of the multiple number of variable length code tables, and the basic functions are same as those of ROM 46 of FIG. 8 or of the combinational logical circuit 51 of FIG. 13, and carries out the variable length decoding in accordance with the state transition diagram corresponding to the variable length code table decided by the first combinational logical circuit 61. The first combinational logical circuit 61 is given conditions to determine which information signal outputs the table No. in accordance with the rule specified by the decoded value.

It is possible to substitute the combinational logical circuits 61 and 62 of FIG. 15 with ROM.

As described above, according to the present invention configuring in such a manner to determine the variable length code and its decoded value by using the state transition circuit has enabled the realization of variable length coding apparatus and variable length decoding apparatus using a ROM with a far smaller storage capacity than that of conventional apparatus.

It is possible to configure the apparatus with a combinational logical circuit without using a ROM, and if the circuit is to be implemented by LSI, the LSI can be designed much easily because of a reduced number of gates.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A variable length decoding apparatus comprising:
   state holding means for holding a state;
   state transition means connected to said state holding means, for shifting the state being held by said state holding means to another state in accordance with a predetermined state transition every time one-bit data of a to-be-decoded variable length code is inputted thereto;
   means for setting said state holding means at a specified state at every breakpoint of the to-be-decoded variable length code; and
   means for feeding back, when a state is outputted from said state transition means, the state from said state transition means to said state holding means,
   wherein said state transition means outputs a state obtained at the breakpoint as a decoded value corresponding to the variable length code every time there is a state transition.

2. A variable length decoding apparatus according to claim 1, wherein said state transition means comprises a memory to store a variable length decode table conforming to the state transition for decoding.

3. A variable length decoding apparatus according to claim 1, wherein said state transition means comprises a logical circuit constructed in accordance with a logical expression corresponding to the state transition.

4. A variable length decoding apparatus comprising:
   table determining means for determining a variable length code table used for coding from a plurality of variable length code tables in which a plurality of variable length codes correspond to a plurality of decoded values;
   state holding means for holding a current state;
   state transition means having said plurality of tables, for outputting a to-be-transited next state and data in accordance with a state transition predetermined in accordance with the variable length table determined by said table determining means and in correspondence with the current state of said state holding means; and
   means for feeding back to said state holding means the state outputted from said state transition means,
   wherein said state transition means outputs as data a decoded value corresponding to the variable length code every time the state is transited.

5. A variable length decoding apparatus comprising:
   state holding means for holding a first state;
   state transition means connected to said state holding means, for determining a second state following the first state by means of the first state being held by said state holding means and input data;
   means for setting said state holding means at the same initial state at every breakpoint at which the decoding of the to-be-decoded variable length code is completed; and
   means for feeding back, when a state is outputted from said state transition means, the state from said state transition means to said state holding means,
   wherein said state transition means outputs a state obtained at the breakpoint as a decoded value corresponding to the variable length code every time there is a state transition.

* * * * *